United States Patent

Duenyas et al.

Patent Number: 5,313,278
Date of Patent: May 17, 1994

[54] SYSTEM FOR PROOFING

[75] Inventors: Isak Duenyas, Tel Aviv, Israel; Eliezer Baron, Brussels, Belgium

[73] Assignee: Scitex Corporation Ltd., Herzliya, Israel

[21] Appl. No.: 749,915

[22] Filed: Aug. 26, 1991

[30] Foreign Application Priority Data

Jul. 21, 1991 [IL] Israel .......... 98902

[51] Int. Cl.⁵ .......... H04N 1/46
[52] U.S. Cl. .......... 358/527; 358/525
[58] Field of Search .......... 358/75, 80, 78, 76

[56] References Cited

U.S. PATENT DOCUMENTS

| | | | |
|---|---|---|---|
| 4,561,016 | 12/1985 | Jung et al. | 358/80 |
| 4,649,566 | 3/1987 | Tsunoda et al. | 358/518 |
| 4,751,569 | 6/1988 | Clinton | 358/518 |
| 4,769,696 | 9/1988 | Utsuda et al. | 358/80 |
| 5,119,182 | 6/1992 | Tsuboi et al. | 358/75 |
| 5,124,788 | 6/1992 | Tsuboi et al. | 358/75 |
| 5,144,419 | 9/1992 | Nakatsuka et al. | 358/75 |

FOREIGN PATENT DOCUMENTS 0310829 4/1989 European Pat. Off. .......... 358/75
62-194779 8/1987 Japan.

OTHER PUBLICATIONS

R. K. Molla "Electronic Color Separation", 1988, R. K. Printing & Publishing Company Charleston, W.V. 25301 U.S. pp. 112, 246, 250–251, 259–263, 266, 268.

J. Souter et al, "High Resolution Direct Digital Color Proofing..." Journal of Imaging Technology, vol. 17, No. 1, Feb. 1991, Springfield, U.S.

Primary Examiner—Edward L. Coles, Sr.
Assistant Examiner—Fan Lee
Attorney, Agent, or Firm—Ladas & Parry

[57] ABSTRACT

A system for proofing which includes color scanning apparatus for scanning an input image and for producing a plurality of color separation signals corresponding to color values in the input image, proofing apparatus for producing a proof of the input image and color modification apparatus, connected between the color scanning apparatus and the proofing apparatus, for capturing the color separation signals while the color scanning apparatus scans the input image and for modifying the color separation signals to produce the proof.

15 Claims, 3 Drawing Sheets

SYSTEM FOR PROOFING

FIELD OF THE INVENTION

The present invention relates generally to color separation systems and to integrated color separation systems performing scanning and proofing together in particular.

BACKGROUND OF THE INVENTION

Proofing of a color printout before printing a large number of copies of the color printout is well-known in the art and is a time-consuming process. The proofing process is illustrated in FIG. 3 and typically includes the scanning of a color original, via a color separation scanner 10 to produce a plurality of color separation signals, typically in the Cyan-Magenta-Yellow-Black (CMYK) color coordinate system.

An exposing unit 12 then utilizes the color separation signals to produce a plurality of films 14, one for each color separation signal.

The films 14 are typically utilized by a printing press 16 for producing a multiplicity of color prints 18. However, because the number of prints 18 produced is very large, a test print, known as a proof 20, is first prepared and used to check that the prints 18 will be as desired. It is generally required that the proof 20 be as close to the print 18 as possible, where closeness is measured in the position of the elements on the page and in the color match between the proof 20 and the prints 18.

There are several parameters that are checked on proof 20. One is the placement of the image on the page, another is the accuracy of the color. If the color accuracy does not match that desired by the customer, then something in the process must be modified. The films 14 can be modified, by a process called dot etching, or new films 14 can be produced by rescanning the color original after at least some of the scanning parameters of the scanner 10 have been changed.

The proof 20 is typically produced in a conventional photomechanical process 22, which mimics the printing process. Examples of a mechanical process 22 are the CROMALIN process of DuPont or the MATCHPRINT process of 3M, both of the USA. If the proof 20 is not desirable for whatever reason, the proofing cycle, the cycle of scanning the original and evaluating the proof, is repeated until an acceptable proof 20 is achieved. This method is time-consuming and can take up to a few days.

Another proofing method is called a press proof. In this method, printing plates are produced from the films 14 and are used to produce proofs by simulating the press run.

A further proofing method, shown with dotted lines, includes the use of a Direct Digital Color Proofer (DDCP) in conjunction with a Color Electronic Prepress System (CEPS) 26. The CEPS receives the color separation signals, allows an operator to manipulate the signals as desired, and then provides the manipulated signals to both the exposing unit 12 and the DDCP 24. An example CEPS is the RESPONSE System manufactured by Scitex Corporation Ltd. of Herzlia, Israel. Example DDCPs are the Approval System manufactured by Eastman Kodak Company of Rochester, N.Y., U.S.A. or the Smartjet 3024 or 4012 proofers manufactured by Iris Graphics Inc. of Bedford, Mass., U.S.A.

The DDCP 24 is controlled by the CEPS 26 and is operative to produce proof 20. If the proof 20 is not desirable, for whatever reason, then either the original is rescanned as described hereinabove, or the operator uses the CEPS 26 to modify the signals as desired.

When the proof 20 is acceptable, the CEPS 26 provides the modified signals to the exposing unit 12 for exposing of films 14 for use in the press run.

The DDCP 24 typically has a different color coordinate system from the printing press 26. Therefore, modification of the color separation signals is necessary to ensure that proof 20 closely resembles the prints 18. U.S. patent application Ser. No. 07/650,468 filed Feb. 4, 1991, now U.S. Pat. No. 5,098,241 to the applicant describe such color modification methods.

Using the DDCP 24 reduces the length of the proof cycle. However, the DDCP 24 works only in conjunction with the CEPS 26. A stand-alone scanner 10 cannot be connected directly to a DDCP and therefore, must produce a proof 20 by first producing films 14.

SUMMARY OF THE INVENTION

It is therefore an object of the present invention to provide a proofing system which provides proofs directly from a scanner, without the use of a CEPS.

There is therefore provided, in accordance with a preferred embodiment of the present invention, a system for proofing. The system includes color scanning apparatus for scanning an input image and for producing a plurality of color separation signals corresponding to color values in the input image, proofing apparatus for producing a proof of the input image and color modification apparatus, connected between the color scanning apparatus and the proofing apparatus, for capturing the color separation signals while the color scanning apparatus scans the input image and for modifying the color separation signals to produce the proof.

Additionally, in accordance with a preferred embodiment of the present invention, the system also includes exposing apparatus for exposing a plurality of films for use in producing an output print of the input image, each film corresponding to one of the color separation signals.

Further, in accordance with a preferred embodiment of the present invention, the scanning and the proofing at least partially overlap each other in time. Still further, the scanning and the exposing at least partially overlap each other in time. In this manner, the scanning of a next input image occurs while proofing of a previous input image occurs.

Moreover, there is provided, in accordance with a preferred embodiment of the present invention, a system for proofing without using a Color Electronic Prepress System (CEPS). The system includes color scanning apparatus for scanning an input image and for producing a plurality of color separation signals corresponding to color values in the input image, proofing apparatus for producing a proof of the input image and color modification apparatus, connected between the color scanning apparatus and the proofing apparatus, for capturing the color separation signals while the color scanning apparatus scans the input image and for modifying the color separation signals to produce the proof.

There is further provided, in accordance with a preferred embodiment of the present invention, color modification apparatus connectable between color scanning apparatus for scanning an input image and proofing apparatus for providing a proof of the input image. The color modification apparatus includes scanner interface apparatus for capturing color separation signals from the color scanning apparatus while the color scanning apparatus scans the input image and color modification apparatus for modifying the color separation signals to produce the proof.

There is also provided, in accordance with a preferred embodiment of the present invention, a method for proofing including the steps of scanning a color input image and producing a plurality of color separation signals corresponding to color values in the input image, while scanning the color input image, capturing the color separation signals and modifying the color separation signals to enable production of a proof of the input image and producing the proof.

Additionally, in accordance with a preferred embodiment of the present invention, the method includes the step of exposing a plurality of films for use in producing an output print of the input image, each film corresponding to one of the color separation signals.

Further, in accordance with a preferred embodiment of the present invention, the step of scanning and the step of proofing at least partially overlap each other in time. The step of scanning and the step of exposing at least partially overlap each other in time.

Finally, in accordance with a preferred embodiment of the present invention, the step of proofing occurs on a previous scanned input image while the step of scanning occurs on a next input image.

BRIEF DESCRIPTION OF THE DRAWINGS

The present invention will be understood and appreciated from the following detailed description, taken in conjunction with the drawings in which.

DETAILED DESCRIPTION OF A PREFERRED EMBODIMENT

Figure 1:
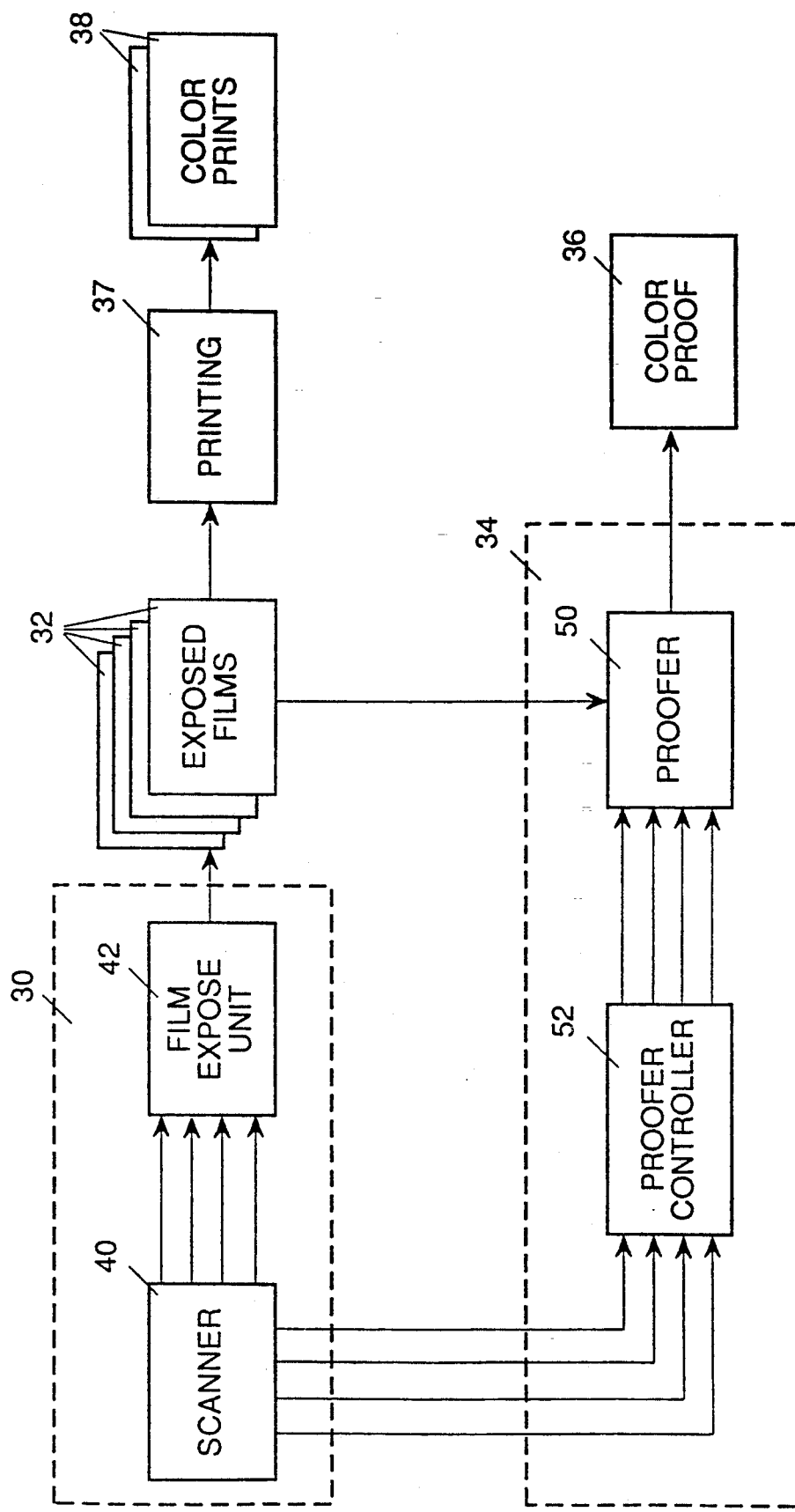
FIG. 1 is a part pictorial, part block diagram illustration of a proofing system for providing proofs directly from a scanner, constructed and operative in accordance with a preferred embodiment of the present invention.

Reference is now made to FIG. 1 which illustrates a proofing system constructed and operative in accordance with a preferred embodiment of the present invention.

The proofing system typically comprises a film producing unit 30 for producing color separation films 32 and a proof producing unit 34 for producing, generally at the same time, a proof 36 of the prints 38 which the color separation films 32 will produce.

The film producing unit 30 is similar to prior art systems and includes a stand-alone color separation scanner 40 for scanning a color original and for providing a plurality of color separation signals, either digital or analog. Unit 30 also comprises an exposing unit 42 for producing from the signals a plurality of color separation films 44 useful in printing.

An example scanner 40 which includes in it film exposing unit 42 is the DS608 manufactured by Dainippon Screen of Tokyo, Japan.

As known in the art, the films 32 are used to make plates for printing press 37 which uses the plates to produce a plurality of prints 38.

The proof producing unit 34 comprises a proofer 50 for providing proof 36 and a proofer controller 52 for digitally capturing the color separation signals of scanner 40 and for providing them, typically after a short delay, to proofer 50.

An example proofer 50 is the Smartjets 4012, manufactured by Iris Graphics Inc.

Figure 2:
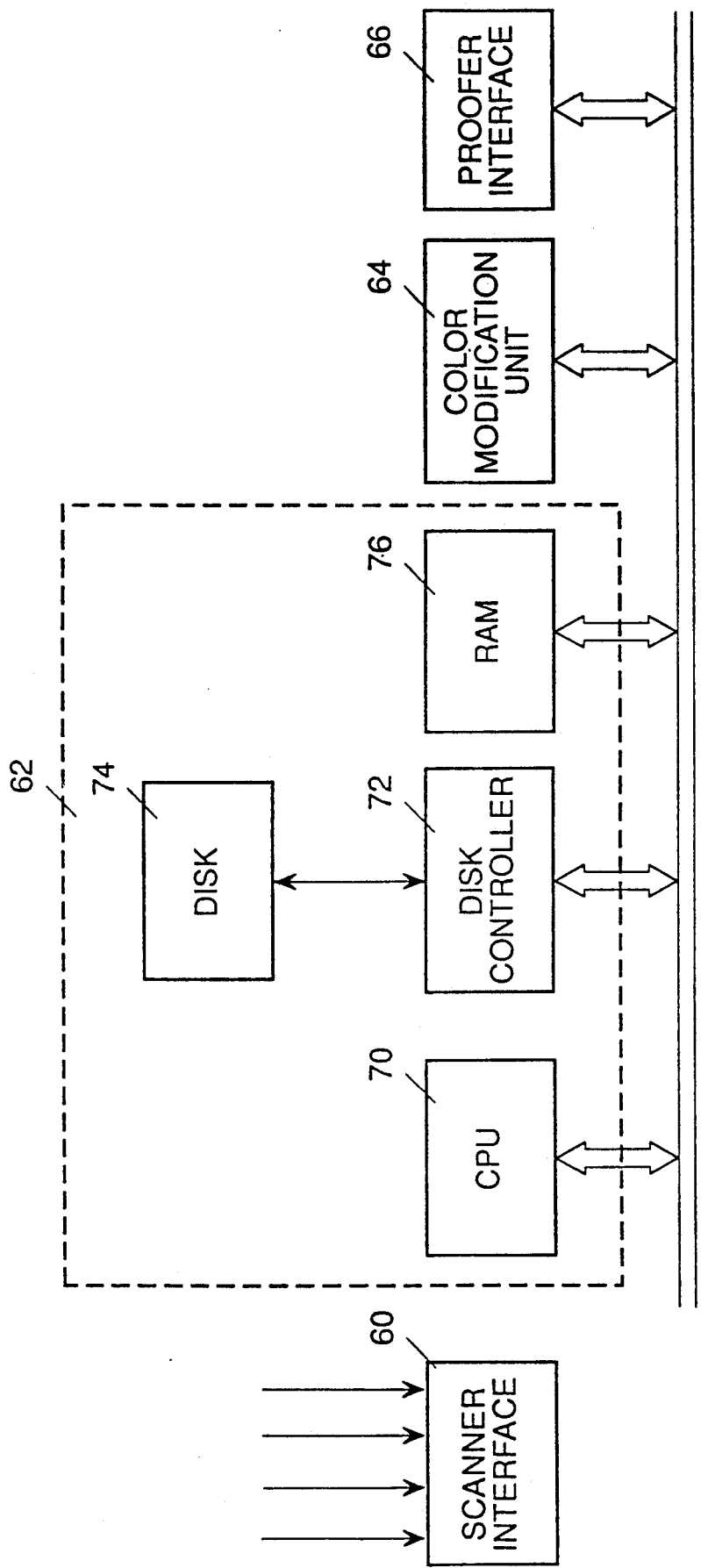
FIG. 2 is a block diagram illustration of a proofer controller forming part of the system of FIG. 1.
Figure 3:
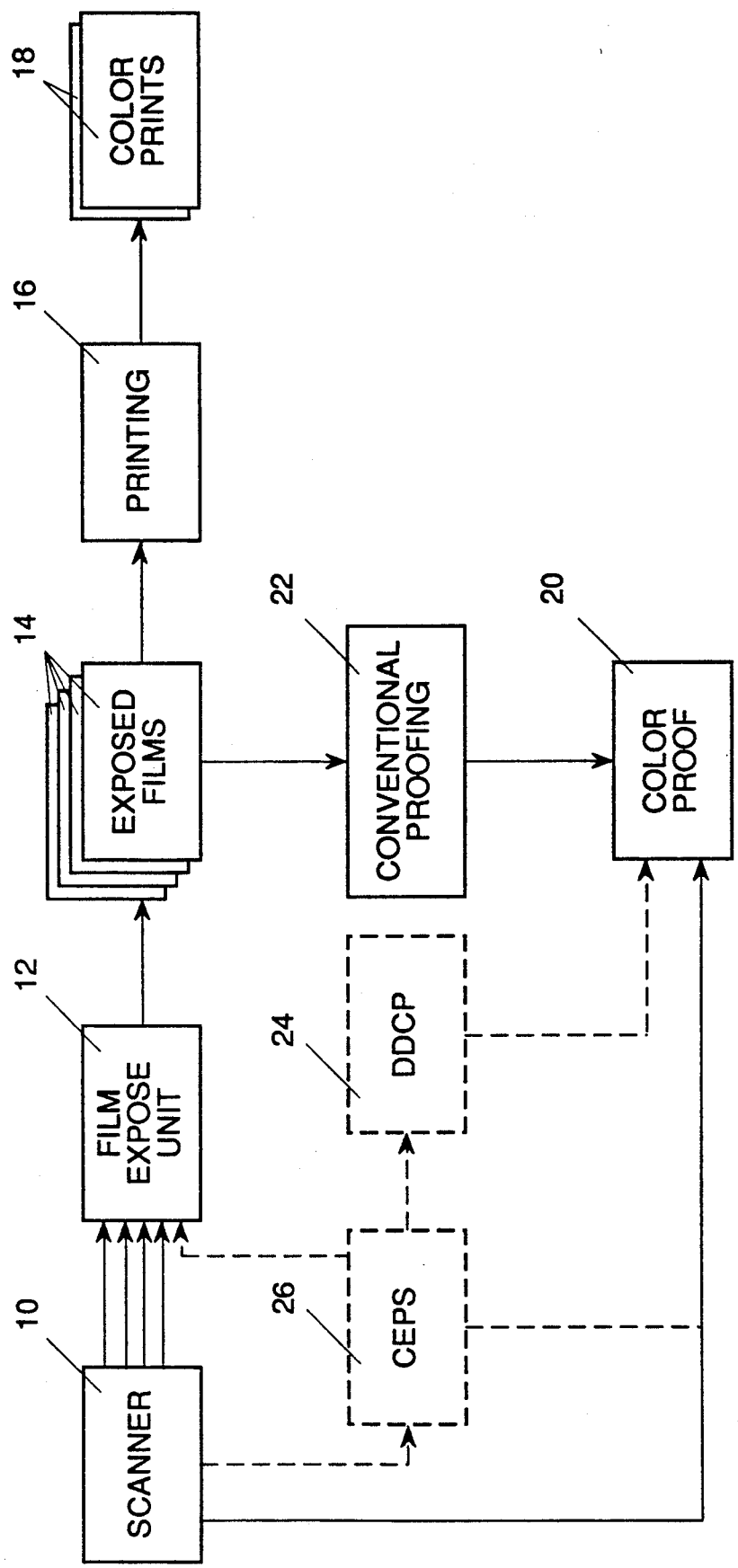
FIG. 3 is a part pictorial, part block diagram illustration of prior art proofing systems.

The elements of proofer controller 52 are shown in FIG. 2 to which reference is now made. Proofer controller 52 typically comprises a scanner interface 60, such as the CSS II Scanner Interface Unit manufactured by Scitex Corporation Ltd. of Herzlia, Israel, for capturing digital color separation signals produced by scanner 40 and a computing unit 62, such as a Whisper Cabinet also manufactured by Scitex, for controlling the operation of the scanner interface 60 and for temporarily storing the color separation signals until proofer 50 is ready to receive them.

Proofer controller 52 additionally comprises a color modification unit 64 for modifying the color separation signals to ensure that the proof 36 closely resembles each press print 38 and a proofer interface 66, such as a Small Computer Serial Interface (SCSI), for providing the modified signals to proofer 50. An example color modification unit 64 is described in U.S. patent application Ser. No. 07/650,468, filed Feb. 4, 1991, now U.S. Pat. No. 5,098,241 which is incorporated herein by reference.

As known in the art, given the same input color separation signals, the proofer 50 and the printing press 37 will produce different colors. Therefore, color modification unit 64 is included in proofer controller 52 to provide proofer 50 with color separation signals which indicate the colors which printing press 37 will print as a result of receiving the input color separation signals.

Computing unit 62 typically comprises a Central Processing Unit (CPU) 70, a disk controller 72 for controlling the input to and output from a disk 74 and a Random Access Memory (RAM) 76.

Because the system of the present invention combines two high speed devices, scanner 40 and proofer 50, temporary storage is needed as a buffer. This storage is provided by RAM 76, if it is large enough to hold many lines of the input image, or, alternatively, by disk 74.

Proofer controller 52 operates as follows. On a command from CPU 70, the scanner interface 60 captures the digital color separation signals without interfering with the operation of any element of film producing unit 30. Scanner interface 60 provides the captured signals to color modification unit 64 for modification as described hereinabove. Color modification unit 64 then provides the modified signals either to proofer interface 66 for transmission to proofer 50, or to storage either in RAM 76 or in disk 74.

Alternatively, the color separation signals can be first stored and then operated on by color modification unit 64 before transmission to proofer 50.

Because of the delay caused by the storage of the color separation signals and by the operation of color modification unit 64, the proof 36 is typically finished a short time after the scanning of the color original is finished.

It will be appreciated that the system of the present invention enables a very short proof cycle by eliminating the need, for a stand-alone scanner 40, to produce proof 36 from the films 32. It also eliminates the need to connect a CEPS 26 to scanner 40.

It is noted that the system of the present invention can be utilized to provide the generally simultaneous throughput of two different originals. While the films 32 and proof 36 of the first original are being produced, the second original is scanned and its data is provided to both the film exposing unit 42 and the proofer controller 52.

It is a feature of the present invention that, due to the operation of scanner interface 60, the film producing unit 30 and the proof producing unit 34 operate in parallel.

It will be appreciated by persons skilled in the art that the present invention is not limited to what has been particularly shown and described hereinabove. Rather, the scope of the present invention is defined only by the claims that follow:

We claim:

1. A system for proofing comprising:
    color scanning means for scanning an input image and for producing a plurality of color separation signals corresponding to color values in said input image;
    proofing means for producing a proof of said input image;
    color modification means, connected between said color scanning means and said proofing means, for capturing said color separation signals while said color scanning means scans said input image and for modifying said color separation signals to produce said proof; and
    exposing means for exposing a plurality of films for use in producing an output print of said input image, each film corresponding to one of said color separation signals, and wherein said proofing means and said exposing means operate at at least partially overlapping times.

2. A system according to claim 1 and wherein said scanning and said proofing at least partially overlap each other in time.

3. A system according to claim 1 and wherein said scanning and said exposing at least partially overlap each other in time.

4. A system according to claim 1 and wherein scanning of a next input image occurs while proofing of a previous input image occurs.

5. A system for proofing without using a Color Electronic Prepress System (CEPS), the system comprising:
    color scanning means for scanning an input image and for producing a plurality of color separation signals corresponding to color values in said input image;
    proofing means for producing a proof of said input image;
    color modification means, connected between said color scanning means and said proofing means, for capturing said color separation signals while said color scanning means scans said input image and for modifying said color separation signals to produce said proof; and
    exposing means for exposing a plurality of films for use in producing an output print of said input image, each film corresponding to one of said color separation signals, and wherein said scanning means is operative to supply signals generally at the same time to said proofing means and said exposing means.

6. Color modification and control apparatus connectable between color scanning apparatus for scanning an image and proofing apparatus for providing a proof of the input image and exposure apparatus for exposing a plurality of films for use in producing an output print of said input image, the color modification apparatus comprising:
    scanner interface means for capturing color separation signals from said color scanning apparatus while said color scanning apparatus scans said input image; and
    color modification means for modifying said color separation signals to produce said proof, said interface means being operative to supply signals to both said proofing apparatus and said exposure apparatus at generally the same time.

7. Color modification apparatus according to claim 6 and wherein said scanning and said proofing at least partially overlap each other in time.

8. Color modification apparatus according to claim 6 and wherein scanning of a next input image occurs while proofing of a previous input image occurs.

9. Color modification apparatus according to claim 7 and wherein scanning of a next input image occurs while proofing of a previous input image occurs.

10. A method for proofing comprising the steps of:
    scanning a color input image and producing a plurality of color separation signals corresponding to color values in said input image;
    while scanning said color input image, capturing said color separation signals and modifying said color separation signals to enable production of a proof of said input image; and
    producing said proof and, generally at the same time exposing a plurality of films for use in producing an output print of said input image, each film corresponding to one of said color separation signals.

11. A method according to claim 10 and also including the step of exposing a plurality of films for use in producing an output print of said input image, each film corresponding to one of said color separation signals.

12. A method according to claim 11 and wherein said step of scanning and said step of proofing at least partially overlap each other in time.

13. A method according to claim 10 and wherein said step of scanning and said step of proofing at least partially overlap each other in time.

14. A method according to claim 10 and wherein said step of scanning and said step of exposing at least partially overlap each other in time.

15. A method according to claim 10 and wherein said step of proofing occurs on a previous scanned input image while said step of scanning occurs on a next input image.

* * * * *